(12) United States Patent
Matsuo et al.

(10) Patent No.: US 8,013,320 B2
(45) Date of Patent: Sep. 6, 2011

(54) NITRIDE SEMICONDUCTOR DEVICE AND METHOD FOR FABRICATING THE SAME

(75) Inventors: Hisayoshi Matsuo, Osaka (JP); Tatsuo Morita, Kyoto (JP); Tetsuzo Ueda, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 1066 days.

(21) Appl. No.: 11/712,482

(22) Filed: Mar. 1, 2007

(65) Prior Publication Data

US 2007/0205407 A1 Sep. 6, 2007

(30) Foreign Application Priority Data

Mar. 3, 2006 (JP) ................................. 2006-058111

(51) Int. Cl.
*H01L 31/00* (2006.01)

(52) U.S. Cl. ................ 257/13; 257/15; 257/22; 257/24; 257/79; 257/103; 257/E29.004; 257/E29.05; 257/E29.253; 257/E33.005; 257/E33.003

(58) Field of Classification Search .................... 257/13, 257/24, E29.004, E29.05
See application file for complete search history.

(56) References Cited

U.S. PATENT DOCUMENTS

| | | | | |
|---|---|---|---|---|
| 5,679,962 A | * | 10/1997 | Kizuki | 257/17 |
| 6,348,096 B1 | * | 2/2002 | Sunakawa et al. | 117/88 |
| 6,613,610 B2 | * | 9/2003 | Iwafuchi et al. | 438/128 |
| 2002/0074561 A1 | * | 6/2002 | Sawaki et al. | 257/103 |
| 2002/0145148 A1 | * | 10/2002 | Okuyama et al. | 257/88 |
| 2004/0048409 A1 | * | 3/2004 | Biwa et al. | 438/46 |
| 2005/0242364 A1 | * | 11/2005 | Moustakas et al. | 257/103 |
| 2006/0118775 A1 | * | 6/2006 | Nagai et al. | 257/13 |
| 2008/0048195 A1 | * | 2/2008 | Okuyama et al. | 257/94 |
| 2009/0159907 A1 | * | 6/2009 | Wang | 257/94 |

FOREIGN PATENT DOCUMENTS

| | | | |
|---|---|---|---|
| JP | 10079504 A | * | 3/1998 |
| JP | 2003-059948 | | 2/2003 |
| JP | 2003-142729 | | 5/2003 |
| JP | 2003-243702 | | 8/2003 |

OTHER PUBLICATIONS

Abstract of Mukai in English.*
S. Chichibu, et al., "Spectroscopic Studies in InGaN Quantum Wells", MRS Internet J. Nitride Semicond. Res. 4S1, G2.7 (1999).
M. Hikita et al., "350V/150A AlGaN/GaN power HFET on Silicon substrate with source-via grounding (SVG) structure" IEDM Tech. Digest 2004.

* cited by examiner

*Primary Examiner* — Hrayr A Sayadian
(74) *Attorney, Agent, or Firm* — McDermott Will & Emery LLP

(57) ABSTRACT

A nitride semiconductor device includes a semiconductor stacked structure which is formed of a nitride semiconductor having a first principal surface and a second principal surface opposed to the first principal surface and which includes an active layer. The first principal surface of the semiconductor stacked structure is formed with a plurality of indentations whose plane orientations are the {0001} plane, and the plane orientation of the second principal surface is the {1-101} plane. The active layer is formed along the {1-101} plane.

20 Claims, 6 Drawing Sheets

NITRIDE SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 2006-58111 filed in Japan on Mar. 3, 2006, the entire contents of which are hereby incorporated by reference.

BACKGROUND OF THE INVENTION (a) Fields of the Invention

The present invention relates to nitride semiconductor devices and their fabrication methods. In particular, the present invention relates to nitride semiconductor devices applicable to field effect transistors or semiconductor light emitting devices and their fabrication methods.

(b) Description of Related Art

Gallium nitride (GaN)-based semiconductors (nitride semiconductors) have wider band gaps than compound semiconductors such as gallium arsenide (GaAs) or semiconductors such as silicon (Si). Thus, on the GaN-based semiconductors, active research and development is being carried out toward realization of light emitting devices capable of emitting blue or green visible light or ultraviolet light. Hitherto, the GaN-based semiconductors have been put into commercial production as light emitting diode devices for various types of displays or semiconductor laser devices for next-generation high-density optical disks.

The GaN-based semiconductors are characterized by high breakdown voltage and high saturated drift velocity, so that they also receive attention as materials for electronic devices such as high-output power devices or high-speed transistors. The GaN-based semiconductor is generally formed on a so-called hetero-substrate made of a different material from the nitride semiconductor, such as sapphire (single crystal $Al_2O_3$) or silicon carbide (SiC). Initially, it was difficult to improve the crystallinity of the nitride semiconductor grown on the hetero-substrate. However, the technique in which a low-temperature buffer layer is used in a metal organic chemical vapor deposition (MOCVD) method was developed, and this technique has made it possible to provide a relatively good nitride semiconductor crystal by using the hetero-substrate.

In a heteroepitaxial growth technique that makes it possible to put an optical device such as a blue light emitting diode device into commercial production, any nitride semiconductor grown has the principal surface with an orientation of (0001) plane, that is, c-plane, and thus, in the nitride semiconductor, spontaneous polarization or piezoelectric polarization occurs in a perpendicular direction to the principal surface. Such polarization generates, in a quantum well structure generally used as an active layer in the light emitting device, a polarization electric field in a well layer with electrons and holes confined therein. This results in spatial separation of electrons and holes, so that a so-called quantum-confined Stark effect, which causes a decrease in light emission efficiency, is observed (see, for example, S. F. Chichibu et al., "SPECTROSCOPIC STUDIES IN InGaN QUANTUM WELLS", MRS Internet J. Nitride Semicond. Res. 4S1, G2.7 (1999)).

Also, in an electronic device, a nitride semiconductor layer is generally formed on the (0001) plane. Thus, the spontaneous polarization or piezoelectric polarization mentioned above generates a polarization electric field perpendicularly to the (0001) plane. Moreover, this polarization also generates fixed charges at the interface and surface of the nitride semiconductor layer. For neutralization of these charges, for example, at the heterointerface between aluminum gallium nitride (AlGaN) and gallium nitride (GaN), a sheet carrier concentration of, for example, $1\times10^{13}$ cm$^{-2}$ or higher is produced although the interface is undoped.

Hitherto, it has been reported that a heterojunction field effect transistor with a large drain current produced by utilizing this high sheet carrier concentration is realizable (see, for example, M. Hikita et al., IEDM Tech. Digest 2004 p. 803). In this document, it has also been reported that electrons therein have a mobility as high as above 1000 cm$^2$/Vs at room temperature, so that great expectation grows on it as a future electronic device as an alternative to the conventional GaAs-compound semiconductor device or Si semiconductor device.

However, as described above, since the conventional GaN-based light emitting device and GaN-based field effect transistor are both formed on the (0001) plane of the nitride semiconductor layer, spontaneous polarization and piezoelectric polarization occur perpendicularly to the (0001) plane. Therefore, for the light emitting device, the quantum-confined Stark effect mentioned above makes it difficult to improve the efficiency of light emission from a quantum well, and thus there are disadvantageous limitations in further intensity and efficiency enhancements.

For the field effect transistor, if it is desired to obtain the normally-off characteristics that is strongly demanded of power devices, resulting polarization electric field described above produces the sheet carrier concentration to the transistor. This disadvantageously makes it difficult to attain the normally-off characteristics.

SUMMARY OF THE INVENTION

In view of the conventional problems, an object of the present invention is to reduce spontaneous polarization generated in a nitride semiconductor to provide, for example, a light emitting device with enhanced intensity and efficiency, or a field effect transistor with normally-off characteristics.

To attain the above object, in the present invention, a nitride semiconductor device is designed so that an active layer is formed along the {1-101} plane as the plane orientation.

To be more specific, a nitride semiconductor device according to the present invention is characterized in that the device includes: a semiconductor stacked structure which is formed of a nitride semiconductor having a first principal surface and a second principal surface opposed to the first principal surface and which includes an active layer, the first principal surface is formed with a plurality of first indentations whose plane orientations are the {0001} plane, the plane orientation of the second principal surface is the {1-101} plane, and the active layer is formed along the {1-101} plane.

With the nitride semiconductor device according to the present invention, the active layer is formed along the {1-101} plane. Therefore, polarization such as spontaneous polarization and piezoelectric polarization is prevented from occurring in the perpendicular direction to the principal surface of the active layer. Thereby, the influence of polarization can be reduced to decrease, in the case of a field effect transistor, the sheet carrier concentration over a wide range, so that operations of a normally-off type transistor can be performed. In the case of a light emitting device, the quantum-confined Stark effect is suppressed to provide a device with a high sensitivity and a high efficiency.

Note that, for example, the {0001} plane of the plane orientation refers to a set of planes equivalent to the (0001) plane, and, for example, the minus sign "−" of the {1-101} plane refers, for descriptive purposes, to inversion of the index "1" following the minus sign.

Preferably, the nitride semiconductor device according to the present invention further includes a substrate of silicon having a plurality of second indentations whose plane orientations are the {111} plane, and the first indentations of the semiconductor stacked structure are formed by growing the semiconductor stacked structure over the second indentations of the substrate.

With this device, a nitride semiconductor with the {0001} plane is grown on the {111} plane of the substrate of silicon, and after completion of filling of the second indentations, the plane orientation of the growth plane is the {1-101} plane. Therefore, the nitride semiconductor device according to the present invention can be provided. Moreover, silicon available easily is used for a substrate for growing the nitride semiconductor, whereby the fabrication cost can be reduced.

Preferably, in the above case, the device further includes a buffer layer formed between the substrate and the semiconductor stacked structure and represented by a general formula of $Al_xGa_{1-x}N$ (where x is $0<x\leq1$).

With this device, stress caused between the substrate and the semiconductor stacked structure is released, whereby the semiconductor stacked structure including the active layer can be formed to have a greater thickness. In the case where such a structure is applied to the field effect transistor, the breakdown voltage can be improved.

Preferably, in the nitride semiconductor device according to the present invention, the principal surface of the substrate has an orientation of {100} plane, and the plurality of second indentations are formed on the {100} plane of the substrate.

With this device, by performing anisotropic etching on the principal surface with the {100} plane, the second indentations whose wall surfaces have an orientation of {111} plane can be formed easily and certainly.

Preferably, in the above case, the substrate is an off-substrate whose principal surface is inclined from the {100} plane.

With this device, the flatness of the second principal surface (the upper surface) of the semiconductor stacked structure can be improved.

Preferably, in the case of providing the substrate, the plurality of second indentations are formed in a striped arrangement.

Preferably, in the case of providing the substrate, the plurality of second indentations are formed in the shapes of inverted quadrangular pyramids and arranged in rows and columns.

With this device, in either case of the striped arrangement and the row-and-column arrangement, the second indentations can be formed uniformly over the entire principal surface of the substrate.

Preferably, in the nitride semiconductor device according to the present invention, the {1-101} plane of the semiconductor stacked structure is flat.

With this device, in the case where such a structure is applied to the field effect transistor, the carrier mobility increases. Therefore, the field effect transistor can be provided which can perform high speed operations and which has a small on-resistance.

Preferably, the nitride semiconductor device according to the present invention further includes: a gate electrode formed on the {1-101} plane of the semiconductor stacked structure; and a source electrode and a drain electrode formed at both sides of the gate electrode, respectively, and the active layer is a channel layer.

With this device, the field effect transistor can be provided as the nitride semiconductor device.

Preferably, in the above case, the channel layer is formed of a heterojunction between a first layer of gallium nitride and a second layer of aluminum gallium nitride.

With this device, a two-dimensional electron gas layer generated by the heterojunction can be used as the channel layer, so that the carrier mobility increases. Therefore, the field effect transistor can be provided which can perform high speed operations and which has a small on-resistance.

Preferably, in the nitride semiconductor device according to the present invention, the semiconductor stacked structure includes: an n-type semiconductor layer formed on the side of the active layer located closer to the first principal surface; and a p-type semiconductor layer formed on the side of the active layer located closer to the second principal surface.

With this device, the light emitting device can be provided as the nitride semiconductor device.

Preferably, the nitride semiconductor device according to the present invention further includes a holding substrate bonded to the second principal surface of the semiconductor stacked structure to hold the semiconductor stacked structure.

With this device, a material with excellent heat dissipation can be used for the holding substrate. Therefore, high output operation can be performed.

Preferably, in the above case, the holding substrate and the semiconductor stacked structure are bonded with an alloy layer containing gold and tin.

With this device, bonding of the semiconductor stacked structure and the holding substrate is facilitated because gold and tin become eutectic.

Preferably, in the above case, the holding substrate is made of silicon.

With this device, a device easy to process at a reduced cost can be provided.

Preferably, in the case where the semiconductor stacked structure includes the n-type semiconductor layer and the p-type semiconductor layer, the active layer is a light emitting layer.

Preferably, in the above case, the first principal surface of the semiconductor stacked structure is exposed, and a first semiconductor layer represented by a general formula of $Al_xGa_{1-x}N$ (where x is $0<x\leq1$) is formed on the exposed surface of the semiconductor stacked structure.

With this device, during the growth of the semiconductor stacked structure, the first semiconductor layer functions as a buffer layer.

Preferably, also in the above case, a second semiconductor layer of n-type gallium nitride is formed in a portion of the semiconductor stacked structure located at the inner side of the first semiconductor layer, a portion of the second semiconductor layer is exposed by selectively removing the first semiconductor layer, and an ohmic electrode is formed on the exposed portion of the second semiconductor layer.

With this device, the ohmic electrode is in contact with the n-type second semiconductor layer having a small sheet resistance, so that a current injected from the ohmic electrode sufficiently spreads also in the lateral direction of the second semiconductor layer. Therefore, a light emitting device can be provided which can emit light uniformly within the surface of the active layer.

A method for fabricating a nitride semiconductor device according to the present invention is characterized in that the method includes: the step (a) of selectively performing an anisotropic etching on the principal surface of a substrate having an orientation of {100} plane, thereby forming a plurality of indentations whose plane orientations are the {111} plane; the step (b) of forming, by epitaxial growth, a semiconductor stacked structure, which is formed of a nitride semiconductor and includes an active layer, over the substrate formed with the plurality of indentations so that the top surface of the semiconductor stacked structure is planarized; and the step (c) of forming at least one first electrode on the semiconductor stacked structure.

With the method for fabricating a nitride semiconductor device according to the present invention, the active layer included in the semiconductor stacked structure is formed along the {1-101} plane. Therefore, polarization such as spontaneous polarization and piezoelectric polarization is prevented from occurring in the perpendicular direction to the principal surface of the active layer. Thereby, the influence of polarization is reduced to decrease, in the case of a field effect transistor, the sheet carrier concentration over a wide range, so that operations of a normally-off type transistor can be performed. In the case of a light emitting device, the quantum-confined Stark effect is suppressed to provide a device with a high sensitivity and a high efficiency. Moreover, since lateral growth is promoted in the semiconductor stacked structure, the crystal defect density can be decreased. Thus, in the case of the field effect transistor, a device having a high carrier mobility and allowing high speed operations can be provided and concurrently the semiconductor stacked structure can be formed to have a greater thickness, thereby offering a high breakdown voltage.

Preferably, in the method for fabricating a nitride semiconductor device according to the present invention, in the step (b), in forming the semiconductor stacked structure, a buffer layer represented by a general formula of $Al_xGa_{1-x}N$ (where x is $0 < x \leq 1$) is formed as a first layer over the indentations.

Preferably, in the method for fabricating a nitride semiconductor device according to the present invention, in the step (b), the active layer is formed by making, in forming the semiconductor stacked structure, a heterojunction between a second layer of gallium nitride and a third layer of aluminum gallium nitride overlying the second layer, and the step (c) includes the step of forming, as the first electrode, a gate electrode on the third layer and a source electrode and a drain electrode at both sides of the gate electrode.

With this method, the heterojunction field effect transistor can be provided as the nitride semiconductor device.

Preferably, in the method for fabricating a nitride semiconductor device according to the present invention, in the step (b), in forming the semiconductor stacked structure, an n-type semiconductor layer, the active layer, and a p-type semiconductor layer are sequentially formed from the substrate side.

With this method, the light emitting device can be provided as the nitride semiconductor device.

Preferably, the method for fabricating a nitride semiconductor device according to the present invention further includes: the step (d) of bonding, after the step (c), a holding substrate to the semiconductor stacked structure to come into contact with the first electrode, the holding substrate holding the semiconductor stacked structure; the step (e) of separating, after the step (d), the substrate from the semiconductor stacked structure; and the step (f) of forming, after the step (e), a second electrode on an exposed surface of the semiconductor stacked structure.

With this method, in the case where this method is applied to the light emitting device, the plurality of indentations provided on the semiconductor stacked structure are formed at the opposite side to the holding substrate, that is, at the output side of the emitted light. Thus, the indentations reduce the amount of emitted light reflected within the semiconductor stacked structure, and thereby the light-extraction efficiency is improved.

Preferably, in the method for fabricating a nitride semiconductor device according to the present invention, the substrate is made of silicon.

With this method, the plurality of indentations whose plane orientations are the {111} plane can be formed certainly on the principal surface of the substrate whose plane orientation is the {100} plane.

BEST MODE FOR CARRYING OUT THE INVENTION

First Embodiment

A first embodiment of the present invention will be described with reference to the accompanying drawings.

Figure 1:
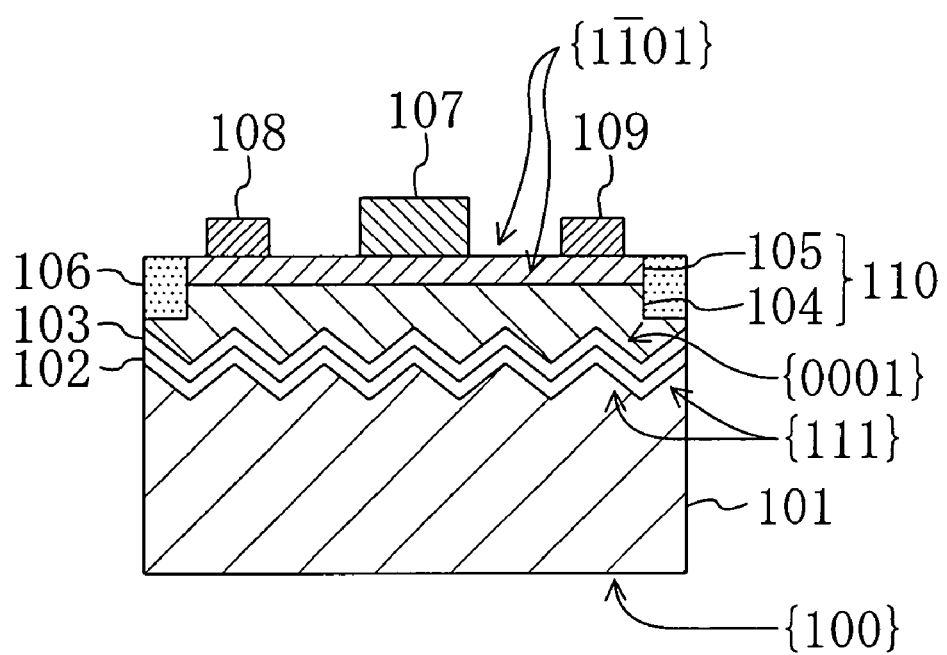
FIG. 1 is a sectional view showing the structure of a field effect transistor which is a nitride semiconductor device according to a first embodiment of the present invention.

FIG. 1 is a sectional view of a nitride semiconductor device according to the first embodiment of the present invention, which illustrates a cross-sectional structure of a heterojunction field effect transistor.

Referring to FIG. 1, a substrate 101 is made of silicon (Si) and has the principal surface with an orientation of {100} plane. On top of the substrate 101, a plurality of indentations composed of a plurality of recesses of V-shaped cross section in a striped arrangement are formed over the entire surface. In this structure, the wall surface of each of the recesses has an orientation of {111} plane of silicon crystal.

On the indentations of the substrate 101, a buffer layer 102, a superlattice layer 103, a channel layer 104, and a carrier supply layer 105 are sequentially formed by epitaxial growth. The buffer layer 102 is made of aluminum nitride (AlN) and has a thickness of about 40 nm. The superlattice layer 103 is made by repeatedly stacking a 5 nm-thick $Al_{0.5}Ga_{0.5}N$ layer and a 20 nm-thick GaN layer for 20 cycles, and has a thickness of 0.5 μm. The channel layer 104 is made of undoped GaN and has a thickness of 3 μm. The carrier supply layer 105 is made of n-type $Al_{0.26}Ga_{0.74}N$ and has a thickness of 25 nm. In this construction, the junction plane between the channel layer 104 and the carrier supply layer 105 constituting a semiconductor stacked structure 110 has an orientation of {1-101} plane, and this heterojunction plane generates a two-dimensional electron gas (2DEG) layer in a portion of the channel layer 104 located around the interface with the carrier supply layer 105. The two-dimensional electron gas layer substantially serves as a channel layer. Note that the thickness of the channel layer 104 is measured from the top end of the convex portion of the substrate 101. The superlattice layer 103 is provided in order to prevent cracks from being created in the semiconductor stacked structure 110.

In the semiconductor stacked structure 110, an isolation region 106 is formed, for example, by selectively oxidizing the structure so that the region extends from the surface to reach the channel layer 104. A Schottky gate electrode 107 of an alloy of palladium (Pd) and silicon (Si) is formed on an element formation region in a potion of the semiconductor stacked structure 110 located inside the isolation region 106. At the both sides of the gate electrode 107, an ohmic source electrode 108 and an ohmic drain electrode 109 are spaced away from the gate electrode, respectively. The source and drain electrodes 108 and 109 are each made of a stacked film of titanium (Ti) and overlying aluminum (Al).

As shown above, in the first embodiment, in the semiconductor stacked structure 110 of a nitride semiconductor, the plane orientation of its upper surface (crystal growth plane) is the {1-101} plane, and the <0001> direction of the zone axis, which acts as the direction of polarization, lies obliquely relative to the {1-101} plane. Thus, a polarization electric field generated in the heterojunction plane between the channel layer 104 and the carrier supply layer 105 has a decreased field intensity as compared to the conventional case where the structure is formed to have an orientation of {0001} plane (=c-plane). As a result of this, in the case like the first embodiment where the heterojunction is formed using the undoped channel layer 104, the sheet carrier concentration of the heterojunction plane also becomes lower than that of the conventional case where the heterojunction plane has an orientation of {0001} plane, and its value is, for example, on the order of $1 \times 10^{12}$ cm$^{-2}$. Therefore, by adjusting the doping concentration for the carrier supply layer 105 made of n-type $Al_{0.26}Ga_{0.74}N$, the drain current and the threshold voltage of the field effect transistor can be controlled over a wide range to provide a normally-off type field effect transistor.

Moreover, in forming the semiconductor stacked structure 110 by crystal growth over the indentations provided on top of the substrate 101, lateral growth is promoted in the semiconductor stacked structure 110. This reduces the crystal defect density in the semiconductor stacked structure 110 to further enhance the carrier mobility in the channel layer 104. As a result, a GaN-based field effect transistor can be provided which has, for example, a large transconductance and a small on-resistance.

Furthermore, by forming the semiconductor stacked structure 110 over the indentations of the substrate 101, cracks caused by the difference in thermal expansion coefficient or lattice constant between Si constituting the substrate 101 and GaN constituting the semiconductor stacked structure 110 can be prevented from occurring in the semiconductor stacked structure 110. Thus, for example, the channel layer 104 can be formed to have a relatively great thickness of about 3 μm, so that a transistor with a higher breakdown voltage can be provided.

In the first embodiment, the indentations formed on top of the substrate 101 are not limited to the structure obtained by forming recesses of V-shaped cross section in a striped arrangement. They may be formed, for example, by arranging depressions in the shapes of inverted quadrangular pyramids in rows and columns over the entire upper surface of the substrate 101. The indentations do not necessarily have to be formed in periodic shape.

In order to further improve the flatness of the {1-101} plane of the semiconductor stacked structure 110, it is desirable to employ a so-called off-substrate in which the plane orientation of the principal surface of the substrate 101 itself is inclined from the {100} plane by, for example, about 7°. In this case, the direction of inclination is preferably the <1-10> direction of the zone axis.

In the first embodiment, in order to conduct a uniform electron transport in the channel region between the source and the drain, for example, it is desirable to form the depressions (the V-shaped recesses) in shapes with a width of several micrometers or greater which corresponds to the distance between the source electrode 108 and the drain electrode 109, or in periodically-arranged ultrafine shapes of 0.5 μm or smaller.

In the case where the depressions are formed in a striped arrangement, it is desirable that the direction in which each depression along the stripe extends be parallel or perpendicular to the direction in which the gate electrode 107 extends.

As described above, with the first embodiment, the sheet carrier concentration of the heterojunction formed in the semiconductor stacked structure 110 can be reduced over a wide range. This provides a so-called normally-off type field effect transistor with a threshold voltage of 0 V or higher.

Hereinafter, a fabrication method of the field effect transistor constructed as shown above will be described with reference to FIGS. 2A to 2D.

Figure 2A:
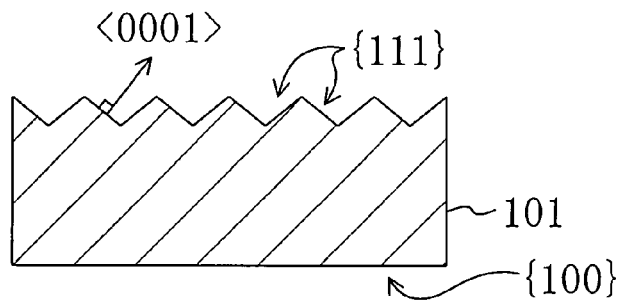
FIGS. 2A to 2D are sectional views showing respective structures in the order of fabrication process steps in a fabrication method of the field effect transistor according to the first embodiment of the present invention.

Referring to FIG. 2A, first, the principal surface of the substrate 101 of Si whose plane orientation is the {100} plane is subjected to anisotropic wet etching with an alkaline solution such as potassium hydroxide (KOH) to form, on top of the substrate 101, a plurality of indentations of V-shaped cross section whose exposed surfaces have an orientation of {111} plane. In this formation, although not shown, the indentations are formed by wet etching using a striped-form or grid-form mask film of silicon dioxide ($SiO_2$) or the like. The intervals and depths of the depressions are controllable by the wet etching condition. The mask film does not necessarily have to be removed, and may be left on the substrate 101.

Figure 3:
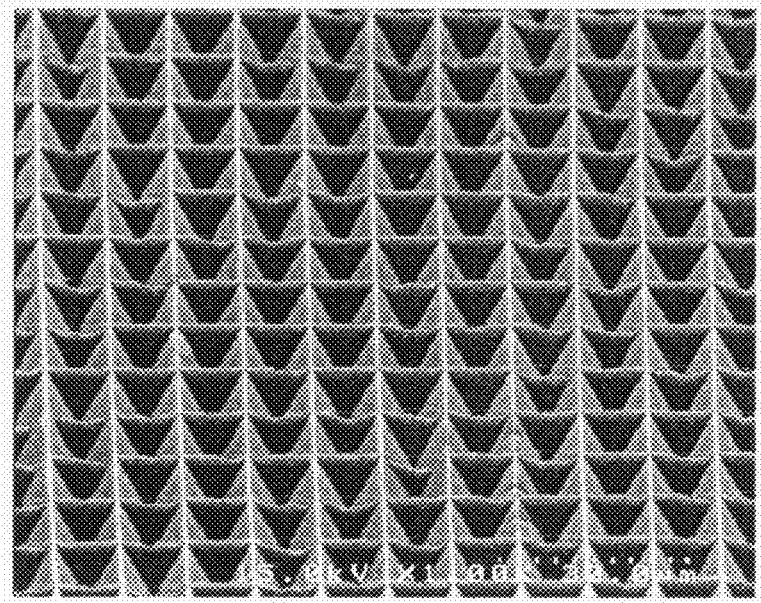
FIG. 3 is a SEM (scanning electron microscope) image of a substrate surface used in a field effect transistor according to a first example of the present invention.

FIG. 3 shows an exemplary photograph, taken by a scanning electron microscope (SEM), of the plurality of indentations formed by arranging depressions in the shapes of inverted quadrangular pyramids in rows and columns.

Figure 2B:
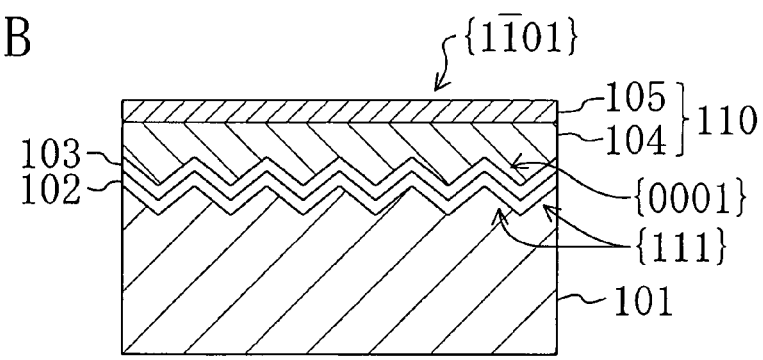

Next, as shown in FIG. 2B, by a MOCVD method or the like, on the substrate 101 formed with the indentations, the buffer layer 102, the superlattice layer 103, and the channel layer 104 are epitaxially grown in this order using, as the material for the layers, ammonia ($NH_3$) as a nitrogen source, TMG (trimethylgallium: $(CH_3)_3Ga$) as a Ga source, and TMA (trimethylaluminum: $(CH_3)_3Al$) as an Al source.

Figure 4:
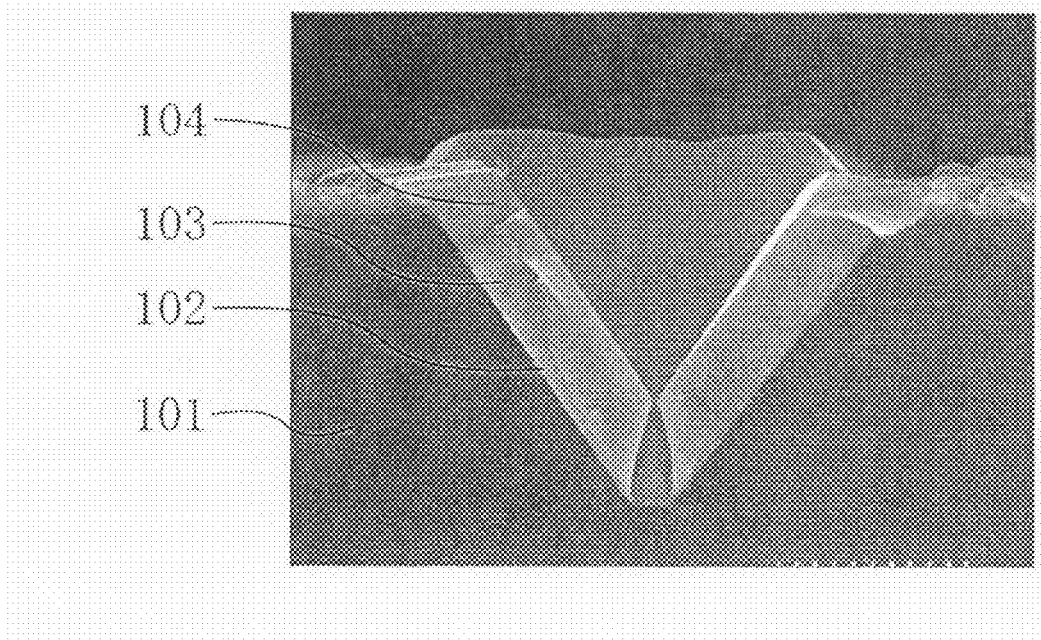
FIG. 4 is a cross-sectional SEM image of a GaN layer grown on a substrate in a field effect transistor according to a second example of the present invention.

FIG. 4 shows an exemplary cross-sectional SEM photograph of the channel layer (GaN layer) 104 epitaxially grown on the depression of V-shaped cross section formed in the substrate 101. From FIG. 4, it is found that the channel layer 104 is selectively grown in the <0001> direction perpendicular to the {111} plane of Si exposed in the depression, that is, the channel layer 104 is selectively grown to have the {0001} plane. When the growth of the channel layer 104 continues even further, the channel layer 104 is finally planarized with the {1-101} plane of GaN serving as the crystal growth plane. If the depressions as shown in FIG. 4 are deep, thicker crystal growth is required. To be more specific, the channel layer 104 is grown to have a thickness of 1 μm with respect to the depression with a depth of 10 µm, and in order to planarize the channel layer 104, it is necessary to additionally grow the layer to have a thickness of 3 µm or greater. Note that as described above, this value of 3 µm is a thickness measured from the top end of the depression. Since the channel layer 104 is laterally grown from the {111} planes of Si exposed from the depressions, crystal defects created in the substrate 101 in the perpendicular direction to the principal surface (=the {100} plane) are reduced. As a result, the crystal defect density is decreased. To be more specific, dislocations, which are crystal defects created from the both wall surfaces of the depression, are combined above the adjacent depressions to reduce the crystal defect density.

Then, $NH_3$ as a nitrogen source, TMG as a Ga source, TMA as an Al source, and monosilane ($SiH_4$) containing Si as an n-type dopant are supplied onto the planarized channel layer 104 to grow the carrier supply layer 105 of n-type $Al_{0.26}Ga_{0.74}N$ having a thickness of 25 nm and a Si concentration of $5 \times 10^{18}$ cm$^{-3}$. Thereby, the semiconductor stacked structure 110 composed of the channel layer 104 and the carrier supply layer 105 is constructed. In this growth, an AlN layer with a thickness of about 1 nm may be provided between the channel layer 104 and the carrier supply layer 105. This provides a preferable effect of further improving the carrier mobility.

Figure 2C:
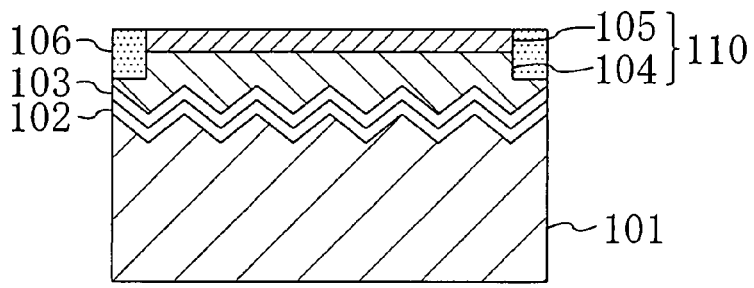

Subsequently, as shown in FIG. 2C, a portion of the semiconductor stacked structure 110 is selectively oxidized to form the isolation region 106 in the upper potion of the semiconductor stacked structure 110.

Figure 2D:
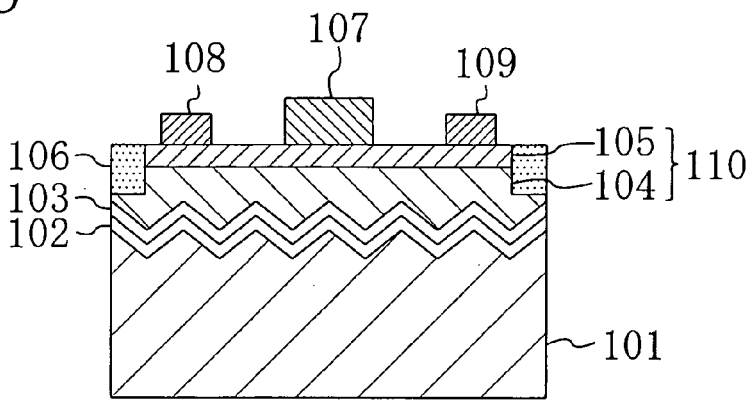

As shown in FIG. 2D, by an electron beam evaporation technique and a liftoff technique, the source electrode 108 and the drain electrode 109 each made of a stacked film of Ti and Al are selectively formed in a potion of the semiconductor stacked structure 110 located inside the isolation region 106. Subsequently, by an electron beam evaporation technique and a liftoff technique, the gate electrode 107 of PdSi is selectively formed in a region between the source electrode 108 and the drain electrode 109. Note that either the source and drain electrodes 108 and 109 or the gate electrode 107 may be formed first. The liftoff technique is as follows: by a lithography method, a photoresist pattern with, for example, an opening for forming an electrode formation region is formed on the semiconductor stacked structure 110, then a predetermined material for an electrode is deposited on the photoresist pattern including the opening, and then the photoresist pattern is removed, thereby disposing the electrode in the electrode formation region.

As shown above, with the fabrication method according to the first embodiment, the GaN-based field effect transistor shown in FIG. 1 can be provided. Specifically, the growth plane of the channel layer 104 included in the semiconductor stacked structure 110 of a nitride semiconductor is set to have an orientation of {1-101} plane, whereby the layer can hardly be affected by the polarization electric field generated by spontaneous polarization and piezoelectric polarization specific to group III-V nitride semiconductor. Thus, the sheet carrier concentration of the heterojunction plane between the channel layer 104 and the carrier supply layer 105 can be reduced over a wide range, which provides a normally-off type transistor with a threshold voltage of 0 V or higher.

Moreover, since the semiconductor stacked structure 110 is epitaxially grown over the indentations provided on top of the substrate 101, its lateral growth can reduce the crystal defect density to provide a large transconductance and a small on-resistance. Furthermore, by the crystal growth over the indentations on top of the substrate 101, the semiconductor stacked structure 110 can be easily formed to have a great thickness. Therefore, a transistor with a high breakdown voltage can be provided.

In addition, since a silicon substrate available easily can be used as the substrate 101 for growing the semiconductor stacked structure 110, the fabrication cost can be reduced.

The material for the substrate 101 is not limited to silicon, and alternatively a cubic crystal material capable of growing nitride semiconductor, such as gallium arsenide (GaAs), cubic silicon carbide (3C—SiC), indium phosphide (InP), or germanium (Ge), can be used thereas.

Second Embodiment

A second embodiment of the present invention will be described with reference to the accompanying drawings.

Figure 5:
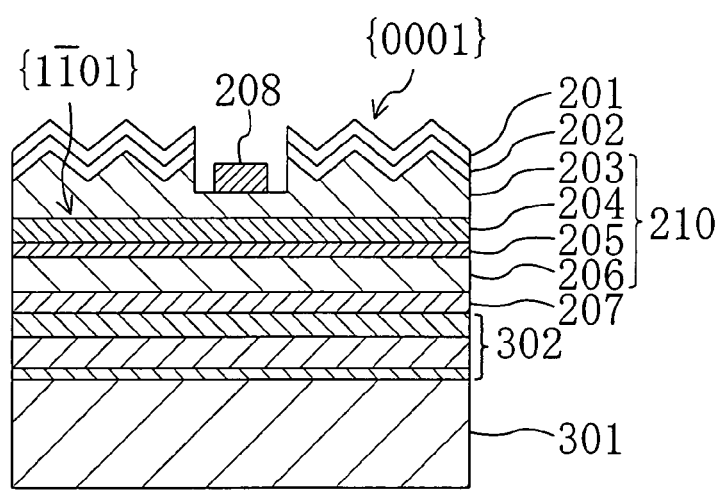
FIG. 5 is a sectional view showing the structure of a light emitting diode device which is a nitride semiconductor device according to the second embodiment of the present invention.

FIG. 5 is a sectional view of a nitride semiconductor device according to the second embodiment of the present invention, which illustrates a cross-sectional structure of a light emitting diode device.

Referring to FIG. 5, the GaN-based light emitting diode device according to the second embodiment is formed in the manner in which a holding substrate 301 of, for example, conductive silicon (Si) and a semiconductor stacked structure 210 of a nitride semiconductor are fixed with a p-side electrode 207 and a solder layer 302 containing gold (Au) and tin (Sn). Note that the material for the holding substrate is not limited to silicon, and use can be made of a material capable of further effectively dissipating heat, such as copper tungsten (CuW).

The semiconductor stacked structure 210 is formed on a growth substrate having been removed (not shown) in the same manner as the first embodiment. The top of the semiconductor stacked structure 210 is formed with: a buffer layer 201 of AlN having a thickness of about 40 nm; and a superlattice layer 202 which is made by repeatedly stacking a 5 nm-thick $Al_{0.5}Ga_{0.5}N$ layer and a 20 nm-thick GaN layer for 20 cycles and which has a thickness of 0.5 µm.

As will be described later, the semiconductor stacked structure 210 is formed by epitaxial growth in the order from top to bottom, and composed of: an n-type contact layer 203 of n-type GaN having a thickness of 1 µm; a multiple quantum well (MQW) active layer 204; a p-type cladding layer 205 of p-type AlGaN having a thickness of 20 nm; and a p-type contact layer 206 of $p^+$-type GaN having a thickness of 200 nm. The MQW active layer 204 is formed by repeatedly stacking, for example, a 3 nm-thick well layer of InGaN and a 5 nm-thick GaN layer for six cycles, and emits, for example, blue light with a wavelength of 470 nm.

The p-side electrode 207 in ohmic contact with the p-type contact layer 206 of the semiconductor stacked structure 210 is formed of a stacked film of, for example, platinum (Pt) and overlying titanium (Ti).

The solder layer 302 has a three-layered structure in which on the top and bottom of an alloy layer of Au and Sn, Au layers are provided, respectively, to sandwich the alloy layer.

The n-type contact layer 203 having indentations on its top surface is formed with an exposed region. The exposed region is formed by selectively removing the buffer layer 201 and the superlattice layer 202 overlying the contact layer 203, and thereby has a flat bottom surface. On the exposed region, an ohmic n-side electrode 208 made of a stacked film of Ti and Al is formed.

In the second embodiment, the plane orientation of the crystal growth plane of the MQW active layer 204 contained in the semiconductor stacked structure 210 is the {1-101} plane as in the case of the first embodiment. Thus, by forming the MQW active layer 204 to have the {1-101} plane, the influence of the polarization electric field is reduced. This suppresses a decrease in the light emission efficiency caused by spatial separation of electrons and holes in the quantum well layer due to an internal electric field in the well layer, that is, a so-called quantum-confined Stark effect. Thereby, the light emission efficiency of the light emitting diode device according to the second embodiment is significantly improved as compared with the conventional case where the active layer is formed to have an orientation of {0001} plane.

In the conventional case where the active layer is formed to have the {0001} plane, an increase in injection current shifts the wavelength of the emitted light toward shorter wavelengths. However, by forming the MQW active layer 204 to have the {1-101} plane, such a phenomenon occurs less prominently.

Furthermore, unlike the structure of the conventional GaN-based light emitting diode device, the light emitting diode device according to the second embodiment has an n-type layer such as the n-type contact layer 202 disposed at the side of the MQW active layer 204 opposite to the holding substrate 301, that is, at the output side of the emitted light. In general, the sheet resistance of a nitride semiconductor is smaller in an n-type layer than in a p-type layer. Thus, even though the diameter of the n-side electrode 208 is decreased to, for example, 100 μm or smaller, a current injected can sufficiently spread also in the lateral direction of the n-type contact layer 203. This results in a uniform radiation of the emitted light.

Moreover, for example, a metal with a higher reflectivity with respect to blue light is selected as the material for the p-side electrode 207 in ohmic contact with the p-type contact layer 206, whereby the efficiency of extraction of the emitted light to the front side (the opposite side to the holding substrate 301), that is, the light emission efficiency can be improved. In the second embodiment, platinum (Pt) is used for the ohmic electrode. However, it is not limited to platinum, and use may be made of a metal with a higher reflectivity, such as silver (Ag) or rhodium (Rh). Furthermore, as the material for the p-side electrode 207, a material with a higher work function is desirably used in order to reduce the contact resistance with the p-type contact layer 206, and it is sufficient to select an appropriate metal material according to the relation between operating voltage and intensity.

In the light emitting diode device according to the second embodiment, the exposed buffer layer 201, the underlying superlattice layer 202, and the top surface of the underlying p-type contact layer 203 are formed in indentation shape. These indentations can prevent reflection of the emitted light within the semiconductor stacked structure 210 and a resulting decrease in the light-extraction efficiency. This improves the light-extraction efficiency to provide a light emitting diode device with a high intensity and a high efficiency.

Moreover, since the n-side electrode 208 and the p-side electrode 207 are disposed at opposed positions with the semiconductor stacked structure 210 interposed therebetween, the chip area can be reduced.

In the second embodiment, description has been made of the case where a blue light with a wavelength of 470 nm is emitted from the MQW active layer 204. However, as long as the MQW active layer 204 is made of a nitride semiconductor, it can have any composition and thickness, and emitted light can have any wavelength ranging from ultra-violet through visible-light. An alternative structure may be employed in which the top surface of the light emitting diode device is coated with a fluorescent material to enable white light emission.

Hereinafter, a fabrication method of the light emitting diode device constructed as shown above will be described with reference to FIGS. 6A to 6C and 7A to 7C.

Figure 6A:
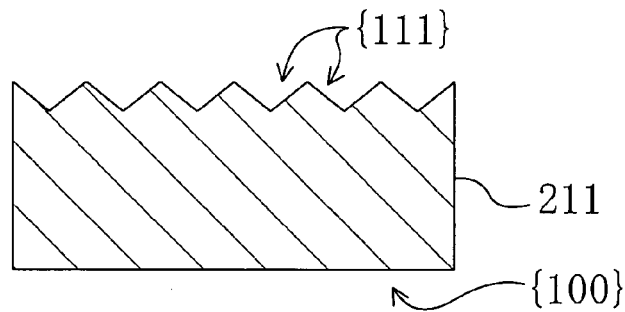
FIGS. 6A to 6C are sectional views showing respective structures in the order of fabrication process steps in a fabrication method of the light emitting diode device according to the second embodiment of the present invention.

Referring to FIG. 6A, first, the principal surface of the growth substrate 211 of Si which has an orientation of {100} plane is subjected to anisotropic etching with an alkaline solution such as KOH to form, on top of the growth substrate 211, a plurality of indentations whose exposed surfaces have an orientation of {111} plane and which are constructed by disposing recesses of V-shaped cross section in a striped arrangement or by arranging depressions in the shapes of inverted quadrangular pyramids in rows and columns.

Figure 6B:
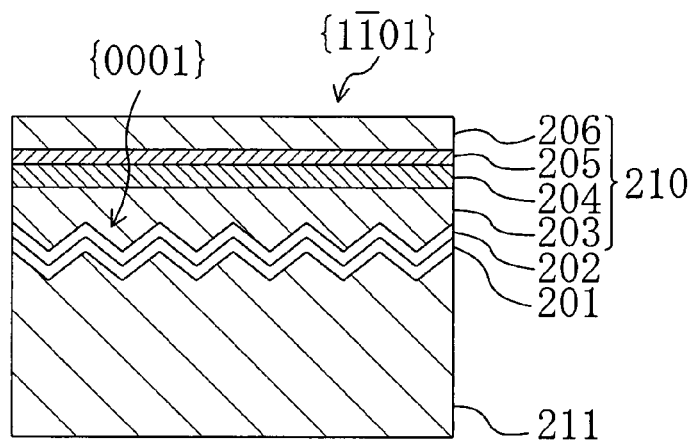

Next, as shown in FIG. 6B, by a MOCVD method or the like, on the growth substrate 211 formed with the indentations, the buffer layer 201, the superlattice layer 202, and the n-type contact layer 203 are epitaxially grown in this order using, as the material for the layers, $NH_3$, TMG, TMA, and $SiH_4$ containing an n-type dopant source. After the n-type contact layer 203 is grown until its top surface is planarized to have the {1-101} plane, the MQW active layer 204 is formed on the planarized n-type contact layer 203 using $NH_3$, TMQ and TMIn (trimethylindium) as the material for the layer. In this formation, the MQW active layer 204 is constructed so that, for example, $In_{0.35}Ga_{0.65}N$ is used for the well layer and GaN is used for the barrier layer, thereby providing blue light emission with a wavelength of 470 nm. In this structure, the MQW active layer 204 is formed on the n-type contact layer 203, but an n-type cladding layer of n-type AlGaN may be provided between the n-type contact layer 203 and the MQW active layer 204.

Then, on the MQW active layer 204, the p-type cladding layer 205 and the p-type contact layer 206 are sequentially formed using, as the materials for the layers, $NH_3$, TMG, TMA, and cyclopentadienyl magnesium ($Cp_2Mg$) containing magnesium (Mg) as a p-type dopant source.

Figure 6C:
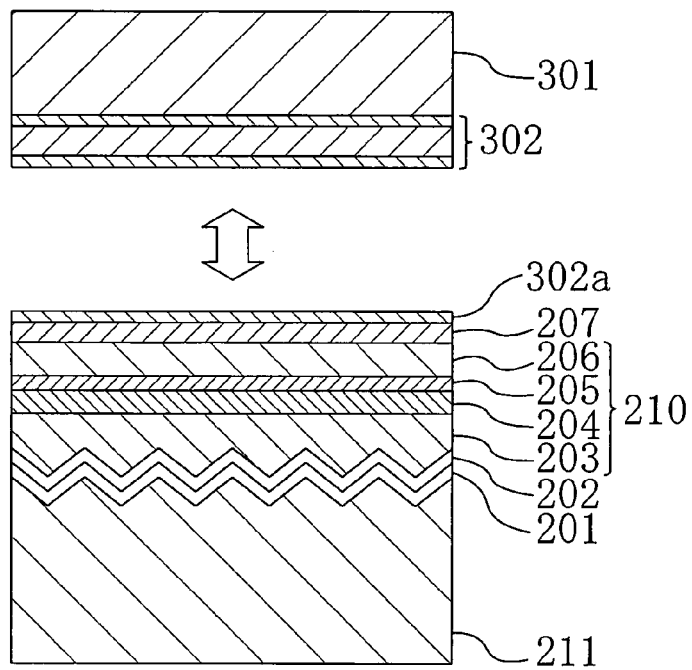

Subsequently, as shown in FIG. 6C, by an electron beam evaporation technique, Pt and Ti are sequentially stacked over the entire surface of the p-type contact layer 206 to form the ohmic p-side electrode 207. Then, by an electron beam evaporation technique, a soldering foundation layer 302a of Au is formed on the p-side electrode 207.

Thereafter, a holding substrate 301 of Si exhibiting conductivity is prepared. On the principal surface of the prepared holding substrate 301, the solder layer 302 of Au, AuSn, and Au is formed by an electron beam evaporation technique. Note that any plane orientation can be employed for the principal surface of the holding substrate 301, but in this structure, the holding substrate 301 having the {100} plane is employed.

Figure 7A:
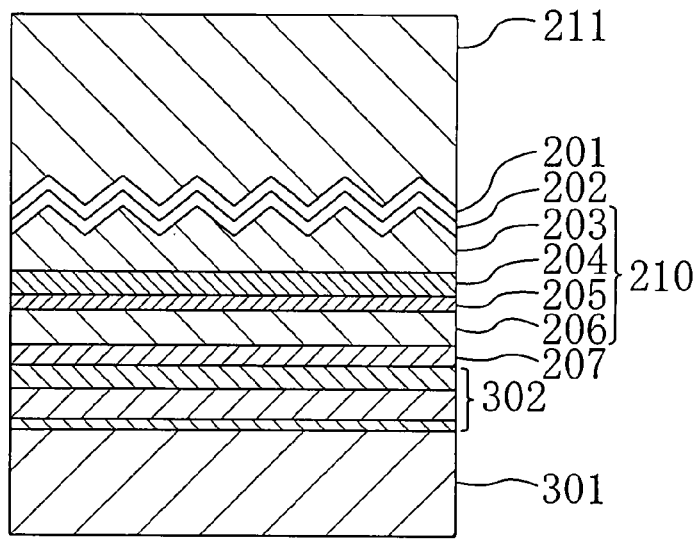
FIGS. 7A to 7C are sectional views showing respective structures in the order of fabrication process steps in the fabrication method of the light emitting diode device according to the second embodiment of the present invention.

While the soldering foundation layer 302a formed over the semiconductor stacked structure 210 over the growth substrate 211 faces the solder layer 302 formed on the principal surface of the holding substrate 301, the semiconductor stacked structure 210 and the holding substrate 301 are bonded to each other. Thereby, the state shown in FIG. 7A is obtained. In this bonding, the growth substrate 211 and the holding substrate 301 are heated and pressurized to produce a eutectic of Au and AuSn.

Figure 7B:
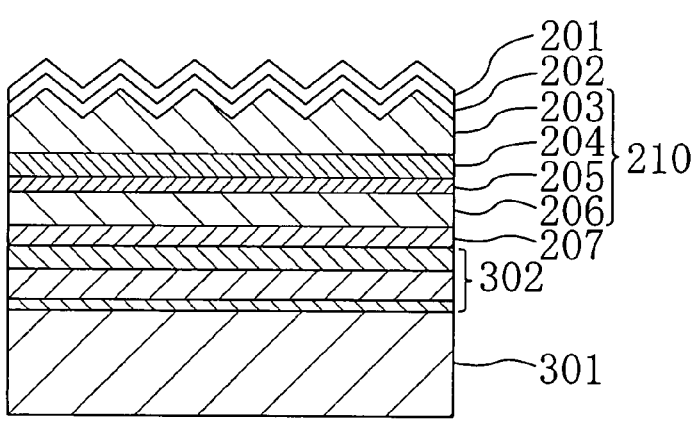

Next, as shown in FIG. 7B, the growth substrate 211 is selectively removed with, for example, a mixed solution of hydrofluoric acid (HF) and nitric acid ($HNO_3$). In this removal, the holding substrate 301 is masked with a wax or the like.

Figure 7C:
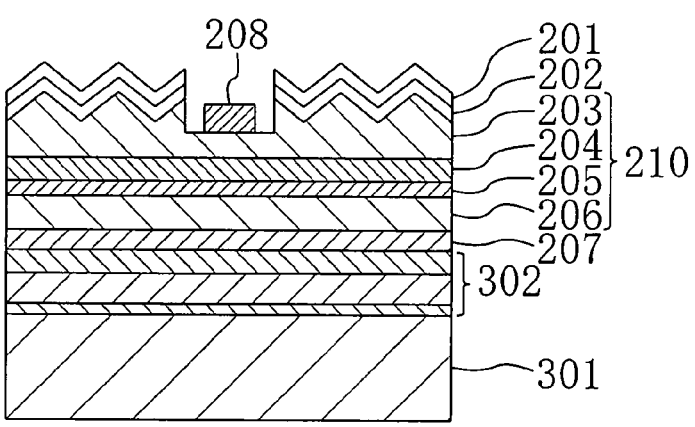

Subsequently, as shown in FIG. 7C, the buffer layer 201 exposed by the removal of the growth substrate 211 and the underlying superlattice layer 202 are subjected to, for example, selective dry etching using inductively coupled plasma (ICP), thereby exposing a portion of the n-type contact layer 203. Then, on the exposed portion of the n-type contact layer 203, the ohmic n-side electrode 208 of a stacked film of Ti and Al is formed by an electron beam evaporation technique and a liftoff technique.

As shown above, with the fabrication method according to the second embodiment, the GaN-based light emitting diode device shown in FIG. 5 can be provided. Specifically, the crystal growth plane of the MQW active layer 204 included in the semiconductor stacked structure 210 of a nitride semiconductor is set to have an orientation of {1-101} plane, whereby the layer can hardly be affected by the polarization electric field generated by spontaneous polarization and piezoelectric polarization specific to group III-V nitride semiconductor. Thus, the quantum-confined Stark effect in the MQW active layer 204 can be suppressed to conduct a highly efficient light emission.

Moreover, by forming the indentations on top of the principal surface of the growth substrate 211, lateral growth is made in the early stage of the growth of the semiconductor stacked structure 210. Thus, the crystal defect density can be reduced to conduct a more highly efficient light emission.

Furthermore, by removing the growth substrate 211, the n-type contact layer 203 with the indentations is positioned at the output side of the emitted light. Therefore, these indentations make it difficult to completely reflect the emitted light. Moreover, since the p-side electrode 207 opposed to the n-type contact layer 203 is formed of a metal with a higher reflectivity with respect to the emitted light, such as Pt, Ag, or Rh, the light-extraction efficiency can be improved to attain a high intensity and a high efficiency.

In addition, since a silicon substrate available easily can be used as the growth substrate 211, the fabrication cost can be reduced.

The material for the growth substrate 211 is not limited to silicon, and alternatively a cubic crystal material capable of growing a nitride semiconductor, such as gallium arsenide (GaAs), cubic silicon carbide (3C—SiC), indium phosphide (InP), or germanium (Ge) can be used thereas.

In the second embodiment, the growth substrate 211 is removed from the semiconductor stacked structure 210 and then the holding substrate 301 is bonded, whereby the emitted light is output from the n-type semiconductor layer side. However, the growth substrate 211 does not necessarily have to be removed. For example, after completion of formation of the structure shown in FIG. 6B, the p-side electrode may be formed on the formed p-type contact layer 206. In this case, however, the growth substrate 211 requires conductivity.

As is apparent from the above, with the nitride semiconductor device and its fabrication method according to the present invention, the influence of the polarization electric field specific to nitride semiconductor can be reduced. Accordingly, the present invention is useful particularly for a field effect transistor, a semiconductor light emitting device, and the like.

What is claimed is:

1. A nitride semiconductor device comprising:
a semiconductor stacked structure, which is formed of a nitride semiconductor, having a first principal surface and a second principal surface opposed to the first principal surface, and which includes an active layer and a superlattice layer,
wherein the first principal surface is formed with a plurality of first indentations whose plane orientations are the {0001} plane, and the plane orientation of the second principal surface is the {1-101} plane,
the active layer is formed along the {1-101} plane, and
the superlattice layer is formed as a plurality of second indentations.

2. The device of claim 1, further comprising a substrate of silicon having a plurality of second indentations whose plane orientations are the {111} plane,
wherein the first indentations of the semiconductor stacked structure are formed by growing the semiconductor stacked structure over the second indentations of the substrate.

3. The device of claim 2, further comprising a buffer layer formed between the substrate and the semiconductor stacked structure and represented by a general formula of $Al_xGa_{1-x}N$ (where x is $0<x\leq 1$).

4. The device of claim 2,
wherein the principal surface of the substrate has an orientation of {100} plane, and the plurality of second indentations are formed on the {100} plane.

5. The device of claim 4,
wherein the substrate is an off-substrate whose principal surface is inclined from the {100} plane.

6. The device of claim 2,
wherein the plurality of second indentations are formed in a striped arrangement.

7. The device of claim 2,
wherein the plurality of second indentations are formed in the shapes of inverted quadrangular pyramids to be arranged in rows and columns.

8. The device of claim 1,
wherein the {1-101} plane of the semiconductor stacked structure is flat.

9. The device of claim 1, further comprising: a gate electrode formed on the {1-101} plane of the semiconductor stacked structure; and a source electrode and a drain electrode formed at both sides of the gate electrode, respectively,
wherein the active layer is a channel layer.

10. The device of claim 9,
wherein the channel layer is formed of a heterojunction between a first layer of gallium nitride and a second layer of aluminum gallium nitride.

11. The device of claim 1,
wherein the semiconductor stacked structure includes: an n-type semiconductor layer formed on the side of the active layer located closer to the first principal surface; and a p-type semiconductor layer formed on the side of the active layer located closer to the second principal surface.

12. The device of claim 1, further comprising a holding substrate bonded to the second principal surface of the semiconductor stacked structure to hold the semiconductor stacked structure.

13. The device of claim 12,
wherein the holding substrate and the semiconductor stacked structure are bonded with an alloy layer containing gold and tin.

14. The device of claim 12,
wherein the holding substrate is made of silicon.

15. The device of claim 11,
wherein the active layer is a light emitting layer.

16. The device of claim 11,
wherein the first principal surface of the semiconductor stacked structure is exposed, and a first semiconductor layer represented by a general formula of $Al_xGa_{1-x}N$ (where x is $0<x\leq 1$) is formed on the exposed surface of the semiconductor stacked structure.

17. The device of claim 16,
wherein a second semiconductor layer of n-type gallium nitride is formed in a portion of the semiconductor stacked structure located at the inner side of the first semiconductor layer,
a portion of the second semiconductor layer is exposed by selectively removing the first semiconductor layer, and
an ohmic electrode is formed on the exposed portion of the second semiconductor layer.

18. The device of claim 1, wherein the plurality of first indentations are formed on the plurality of second indentations.

19. The device of claim 1, further comprising a plurality of electrodes formed on the semiconductor stacked structure and formed on a continuous surface as seen in a cross-sectional view, and the plurality of the first indentations are formed between the plurality of electrodes.

20. The device of claim 1, further comprising source and drain electrodes formed on the semiconductor stacked structure, and the plurality of the first indentations are formed between the source and drain electrodes.

* * * * *